United States Patent
Li et al.

(10) Patent No.: US 10,054,617 B2
(45) Date of Patent: Aug. 21, 2018

(54) METHOD AND APPARATUS FOR ZERO CURRENT DETECTION

(71) Applicant: Fairchild Semiconductor Corporation, San Jose, CA (US)

(72) Inventors: Maoxu Li, Shanghai (CN); Dong Li, Shanghai (CN)

(73) Assignee: Fairchild Semiconductor Corporation, Phoenix, AZ (US)

( * ) Notice: Subject to any disclaimer, the term of this patent is extended or adjusted under 35 U.S.C. 154(b) by 0 days.

(21) Appl. No.: 14/937,667

(22) Filed: Nov. 10, 2015

(65) Prior Publication Data

US 2016/0139183 A1    May 19, 2016

Related U.S. Application Data

(63) Continuation of application No. 13/896,967, filed on May 17, 2013, now abandoned.

(30) Foreign Application Priority Data

May 19, 2012  (CN) .......................... 2012 1 0163278

(51) Int. Cl.
*H02M 3/158*      (2006.01)
*G01R 19/175*    (2006.01)
(Continued)

(52) U.S. Cl.
CPC .......... *G01R 19/175* (2013.01); *H02M 3/156* (2013.01); *H02M 3/158* (2013.01); *H02M 2001/0009* (2013.01)

(58) Field of Classification Search
CPC ...... H02M 1/32; H02M 1/4225; H02M 1/083; H02M 2001/0009; H02M 2001/0058;
(Continued)

(56) References Cited

U.S. PATENT DOCUMENTS

| | | | |
|---|---|---|---|
| 5,359,652 | A | 10/1994 | Mulder et al. |
| 7,982,445 | B1 | 7/2011 | Xin-Leblanc |

(Continued)

FOREIGN PATENT DOCUMENTS

| | | |
|---|---|---|
| CN | 101213460 A | 7/2008 |
| CN | 101213460 A | 7/2008 |

(Continued)

OTHER PUBLICATIONS

"U.S. Appl. No. 13/896,967, Non Final Office Action dated May 21, 2015", 19 pgs.

(Continued)

*Primary Examiner* — Timothy J Dole
*Assistant Examiner* — Bryan R Perez
(74) *Attorney, Agent, or Firm* — Brake Hughes Bellermann LLP

(57) ABSTRACT

This application discusses, among other things, zero current detection. In an example, a circuit for zero current detection can include a compensating circuit and a detecting circuit. The compensating circuit can be configured to feed back a compensating voltage to the detecting circuit according to an output voltage of a DC-DC converting circuit. The detecting circuit can be configured to dynamically adjust an intentional offset voltage according to the compensating voltage, and to perform zero current detection of the DC-DC converting circuit according to the adjusted Voffset.

19 Claims, 14 Drawing Sheets

(51) Int. Cl.
*H02M 3/156* (2006.01)
*H02M 1/00* (2006.01)

(58) Field of Classification Search
CPC ......... H02M 2001/0032; H02M 3/156; H02M 3/158; H02M 3/1588; H02M 3/155; H02M 3/1582; H02M 3/157; H02M 3/1563; H02M 2003/1566; H02M 2003/1557; H02M 2001/0012
USPC .......... 323/288, 271, 282, 284–285
See application file for complete search history.

(56) References Cited

U.S. PATENT DOCUMENTS

| | | |
|---|---|---|
| 2002/0089314 A1 | 7/2002 | Susak et al. |
| 2006/0261786 A1 | 11/2006 | Tiew et al. |
| 2006/0279269 A1 | 12/2006 | Yang |
| 2007/0024263 A1 | 2/2007 | Yang |
| 2007/0200546 A1 | 8/2007 | Logiudice et al. |
| 2008/0224674 A1* | 9/2008 | Hasegawa ............ H02M 3/158 323/271 |
| 2008/0231244 A1 | 9/2008 | Yamada |
| 2008/0231247 A1 | 9/2008 | Uehara |
| 2009/0218998 A1 | 9/2009 | Huang et al. |
| 2009/0295353 A1 | 12/2009 | De Lima et al. |
| 2010/0194481 A1 | 8/2010 | Hase et al. |
| 2010/0308784 A1* | 12/2010 | Scoones ............... H02M 1/32 323/282 |
| 2010/0329293 A1 | 12/2010 | Taubman |
| 2011/0057704 A1 | 3/2011 | Ptacek et al. |
| 2011/0102063 A1 | 5/2011 | Zeller |
| 2011/0187340 A1 | 8/2011 | Deval et al. |
| 2011/0291632 A1 | 12/2011 | Yu et al. |
| 2012/0119715 A1* | 5/2012 | Loikkanen ......... H02M 3/1582 323/235 |
| 2013/0307507 A1 | 11/2013 | Li et al. |

FOREIGN PATENT DOCUMENTS

| | | |
|---|---|---|
| CN | 102023286 A | 4/2011 |
| CN | 102128973 A | 7/2011 |
| CN | 102193025 A | 9/2011 |
| CN | 202649298 U | 1/2013 |

OTHER PUBLICATIONS

"U.S. Appl. No. 13/896,967, Response filed Apr. 1, 2015 to Restriction Requirement dated Feb. 5, 2015", 12 pgs.
"U.S. Appl. No. 13/896,967, Restriction Requirement dated Feb. 5, 2015", 6 pgs.
"Chinese Application Serial No. 201210163278.1 Office Action dated Mar. 24, 2015", w/ English Claims, 12 pgs.
Hui, Wang, et al., "A Design for Zero-detect Circuit of Synchronous Rectification Buck DC-DC Converter", w/ English Abstract, (Mar. 24, 2009), 5 pgs.
"A Design for Zero-detect Circuit of Synchronous Rectification Buck DC-DC Converter" Hui Wang etc., Research& Progress of SSE, p. 276-280, No. 2, vol. 30, Jun. 2010.

* cited by examiner

… (US 10,054,617 B2)

METHOD AND APPARATUS FOR ZERO CURRENT DETECTION

CLAIM OF PRIORITY

This application is a continuation of U.S. patent application Ser. No. 13/896,967, filed on May 17, 2013, which claims the benefit of priority under 35 U.S.C. 119 to China Patent Application Number, 201210163278.1, entitled, "CIRCUIT AND METHOD FOR ZERO CURRENT DETECTION AND VOLTAGE CONVERSION," filed May 19, 2012, hereby incorporated by reference herein in its entirety.

TECHNICAL FIELD

The present disclosure relates to circuit protection techniques, in particular to a apparatus and methods for zero current detection (ZCD.

BACKGROUND

A Direct Current-to-Direct Current (DC-DC) converter, or converting circuit, is commonly used in electronic devices. A typical DC-DC converting circuit has a BUCK circuit, or a BOOST circuit. FIG. 1 illustrates a BUCK circuit. When the driving signal is at a high level, the PMOS P1 is off, the NMOS N1 serving as a freewheeling transistor is on, the current on the inductor L1 is 0, the switch node (SW) is the drain of the NMOS N1, the change in the voltage of SW can reflect the change in the current on the inductor L1. In this case, the voltage of SW is 0, triggering a zero current detection circuit. FIG. 2 illustrates a BOOST circuit. When the driving signal is at a high level, the PMOS P2 is off, the NMOS N2 serving as a regulating transistor is on, the current on the inductor L2 is 0, SW is the drain of the NMOS N2, the change in the voltage of SW can reflect the change in the current on inductor L2. In this case, the voltage of SW equals the output voltage of the BOOST circuit, triggering the zero current detection circuit.

Typically, a zero current detection circuit is implemented with a comparator, as shown in FIG. 3. The positive output of the comparator C1 is connected to a reference voltage (Vref) and an intentional offset voltage (Voffset), the switch S21 is connected in parallel with Voffset. The negative input of the comparator C1 is connected to the capacitor CS21, switch S22, and SW. The negative input of the comparator C1 is connected to an output via the switch S24. The negative electrode of the capacitor CS21 is grounded via the switch S23. When the zero current detection circuit enters a sampling state, as shown in FIG. 4, the switches S21 and S22 are open, the switches S23 and S24 are closed, and the voltage of the capacitor CS21 is the sum of Vref and Voffset. When the zero current detection circuit enters a comparing state, as shown in FIG. 5, the switches S21 and S22 are closed, the switches S23 and S24 are open. When the sum of the voltages of SW and of capacitor CS21 is equal to Vref, the comparator C1 flips to output an enabling signal of zero current detection, in which case, the voltage of SW is equal to negative Voffset.

In a practical application, the zero current detection circuit has an operation delay (t-delay) and Voffset is set to be a constant. Thus, when the output voltage (Vout) of the DC-DC converting circuit increases, within the same time period of t-delay, the change in the voltage of SW is even greater. Although the voltage of SW for triggering the zero current detection circuit to start responding remains the same, after the t-delay, namely, when responding of the zero current detection circuit ends, the voltage of SW becomes even greater, indicating a larger current in the inductor, thereby reducing the accuracy of the zero current detection.

For example, FIG. 6 and FIG. 7 illustrate graphically the voltage of SW versus time in a zero current detection circuit for the BUCK circuit and for the BOOST circuit, respectively. For a BUCK structure, the output voltage Vout1 is greater than the output voltage Vout2, the slope of the curve of the voltage of SW corresponding to the output voltage Vout1 versus time is greater than the curve of the voltage of SW corresponding to the output voltage Vout2 versus time, Voffset is set to be a constant. Under the circumstance of the same t-delay, when the zero current detection circuit corresponding to output voltage Vout1 completes responding (namely, when the output voltage of the detecting circuit completes a logic flip), the voltage of SW is V1, time is T1. When the zero current detection circuit corresponding to output voltage Vout2 completes responding, the voltage of SW is V2, time is T2. It can be seen that, in the BUCK circuit, |V1−V2| is larger, that is, the voltage of SW at the completion of the response of the zero current detection circuit becomes even greater as the output voltage increases. In the BOOST circuit, |V1−Vout1| is much larger than |V2−Vout2|, that is, the difference between the voltage of SW at the completion of the response of the zero current detection circuit and the output voltage becomes even greater as the output voltage increases.

OVERVIEW

This application discusses, among other things, zero current detection. In an example, a circuit for zero current detection can include a compensating circuit and a detecting circuit. The compensating circuit can be configured to feed back a compensating voltage to the detecting circuit according to an output voltage of a DC-DC converting circuit. The detecting circuit can be configured to dynamically adjust an intentional offset voltage according to the compensating voltage, and to perform zero current detection of the DC-DC converting circuit according to the adjusted Voffset.

This overview is intended to provide a general overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
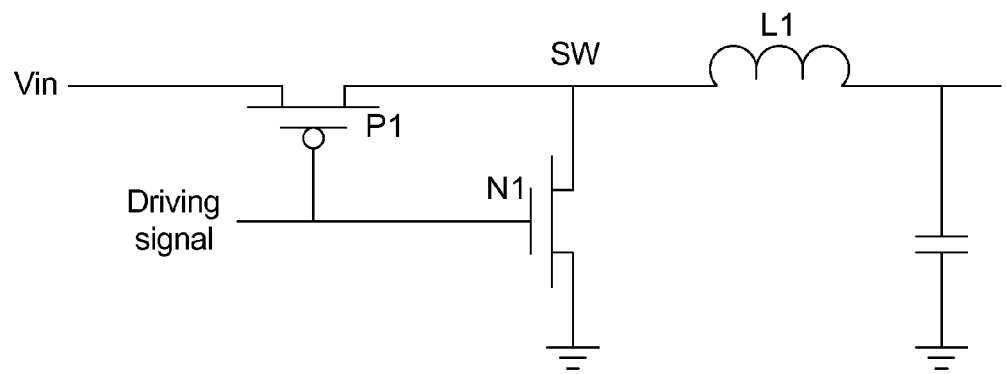
FIG. 1 illustrates an existing BUCK circuit.
Figure 2:
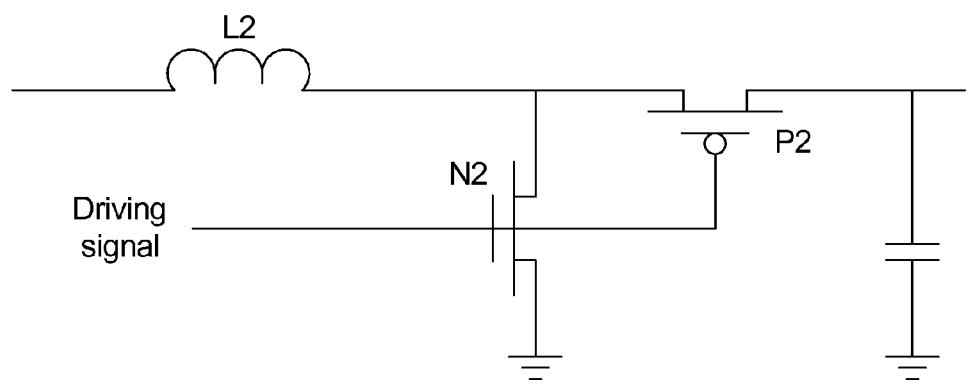
FIG. 2 illustrates an existing BOOST circuit.
Figure 3:
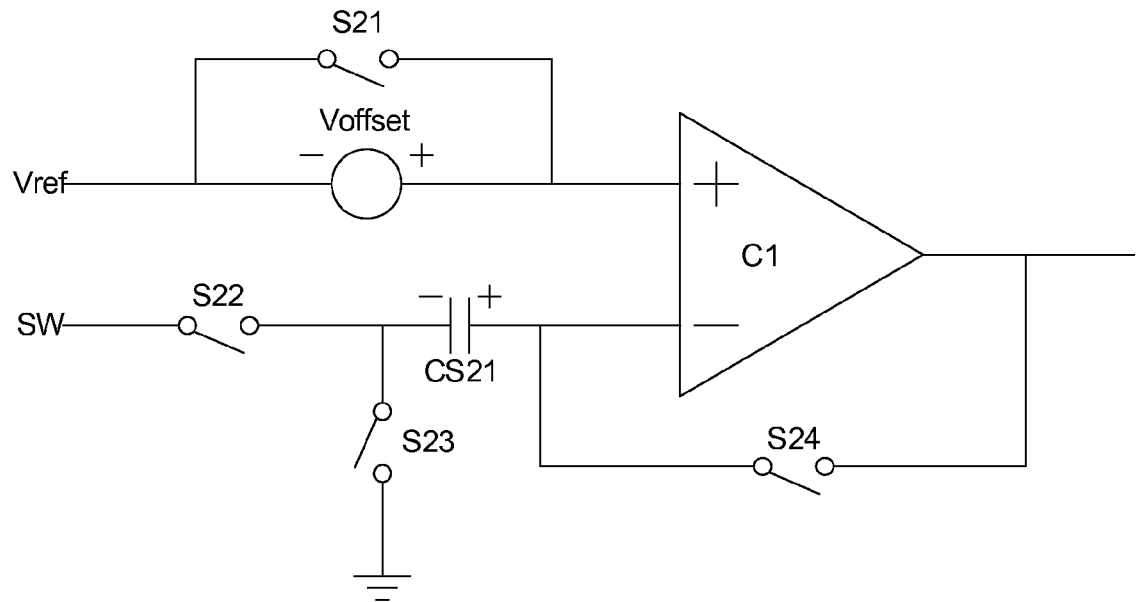
FIG. 3 illustrates an existing zero current detection circuit.
Figure 4:
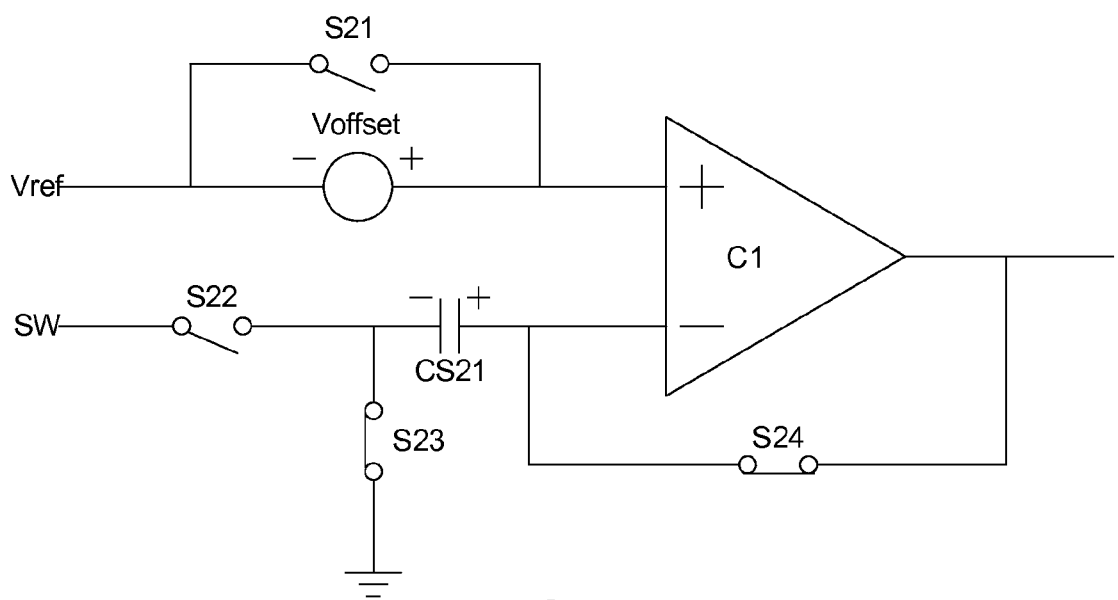
FIG. 4 illustrates a sampling state of the zero current detection circuit in FIG. 3.
Figure 5:
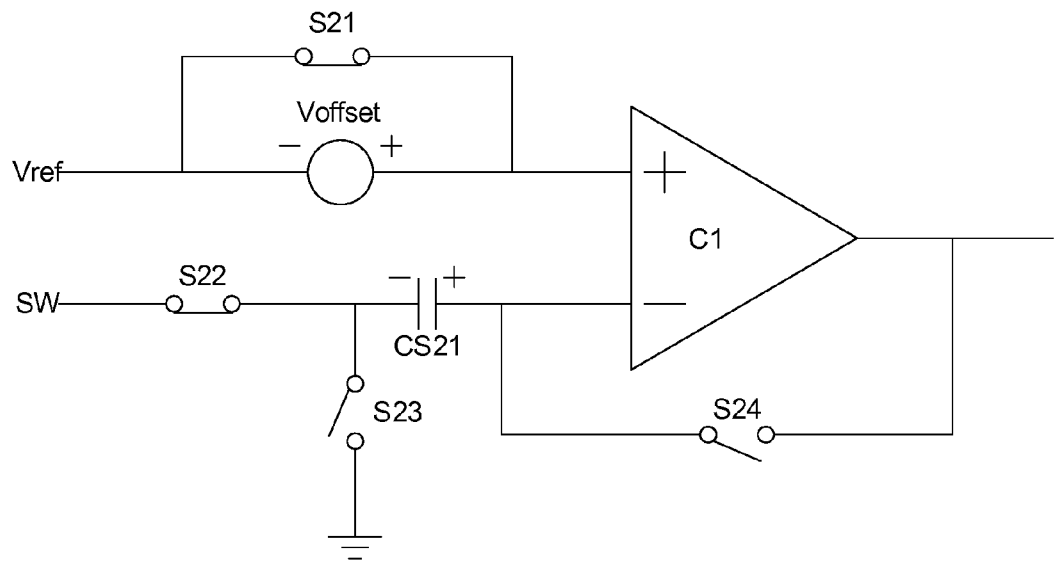
FIG. 5 illustrates a comparing state of the zero current detection circuit in FIG. 3.
Figure 6:
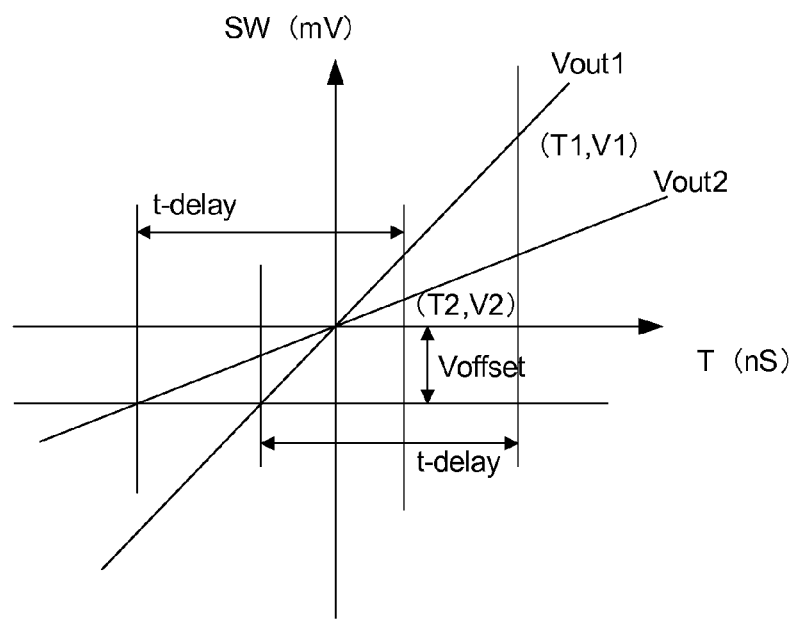
FIG. 6 illustrates graphically the voltage of SW versus time in the zero current detection circuit for an existing BUCK circuit.
Figure 7:
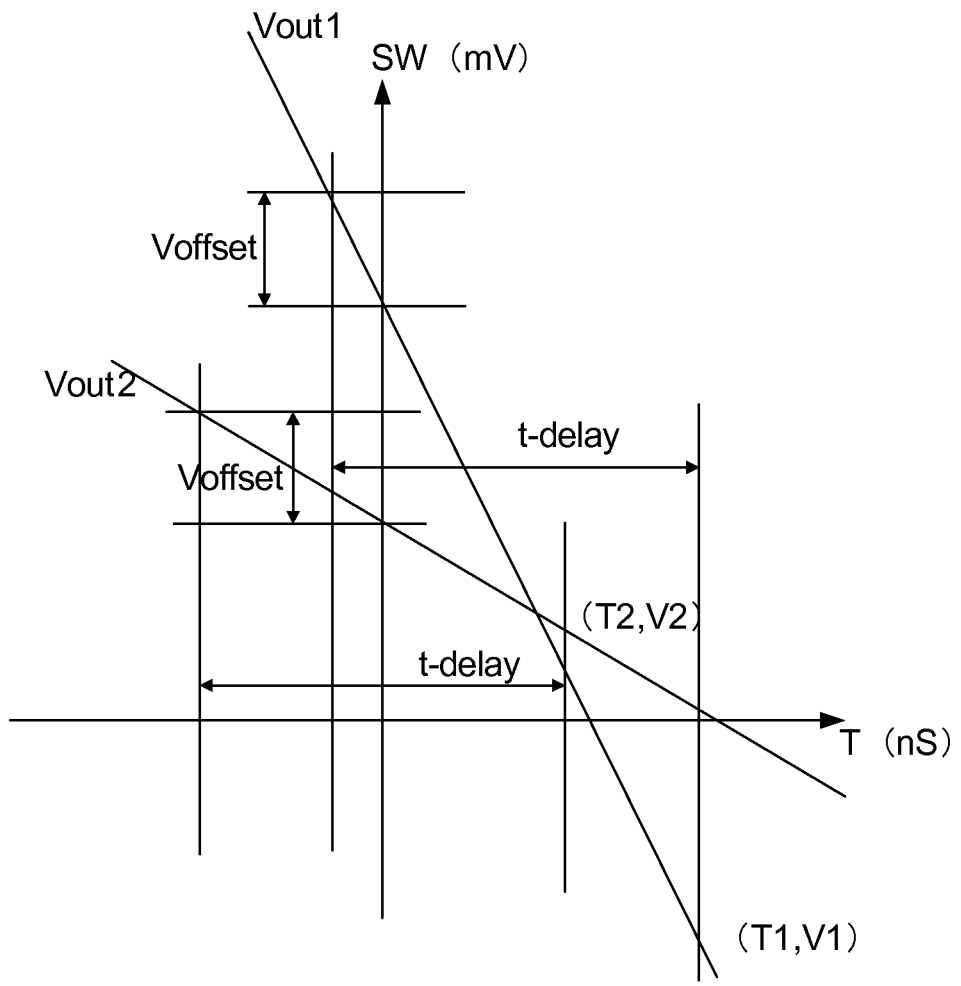
FIG. 7 illustrates graphically the voltage of SW versus time in the zero current detection circuit for an existing BOOST circuit.

The present inventors have recognized a circuit and a method for zero current detection and voltage conversion. In certain examples, a zero current detection circuit can include a compensating circuit and a detecting circuit. The compensating circuit can be configured to feed back a compensating voltage to the detecting circuit according to the output voltage of a DC-DC converting circuit. The detecting circuit can configured to dynamically adjust an intentional offset voltage (Voffset) according to the compensating voltage, and can perform zero current detection of the DC-DC converting circuit according to the adjusted Voffset.

In certain examples, a BUCK converter can include a circuit for zero current detection. The BUCK circuit can be configured to receive an input DC voltage and to generate a lower output voltage using a switch device. The zero current detection circuit can be configured to dynamically adjusts an intentional offset voltage (Voffset) according to the output voltage, and can perform zero current detection of the BUCK converter according to the adjusted Voffset.

In certain examples, a BOOST converter can include a circuit for zero current detection. The BOOST circuit can be configured to receive an input DC voltage and to generate a higher output voltage using a switch device. The zero current detection circuit can be configured to dynamically adjust an intentional offset voltage (Voffset) according to the output voltage, and can perform zero current detection of the BOOST circuit according to the adjusted Voffset.

In certain examples, a method for zero current detection can include feeding back a compensating voltage to the detecting circuit according to the output voltage of a direct-current-to-direct-current (DC-DC) converting circuit, and dynamically adjusting Voffset according to the compensating voltage, and performing zero current detection of the DC-DC converting circuit according to adjusted Voffset.

In certain examples, an circuit for zero current detection can include a compensating circuit and a detecting circuit, wherein the compensating circuit feeds back a compensating voltage to the detecting circuit according to the output voltage of a DC-DC converting circuit, and the detecting circuit dynamically adjusts Voffset according to the compensating voltage and performs zero current detection according to adjusted Voffset. Thus, the voltage of SW triggering the circuit for zero current detection can change as the output voltage of the DC-DC converting circuit changes, thereby increasing the accuracy of zero current detection effectively when the triggering delay of the circuit for zero current detection remains unchanged.

In certain examples, an intentional offset voltage Voffset can increase as the output voltage Vout of a DC-DC converting circuit increases to improve the accuracy of zero current detection. In certain examples, a compensating circuit can feed back a compensating voltage to a detecting circuit according to the output voltage of a DC-DC converting circuit and a detecting circuit can dynamically adjusts Voffset according to the compensating voltage, and can perform zero current detection according to the adjusted Voffset.

Figure 8:
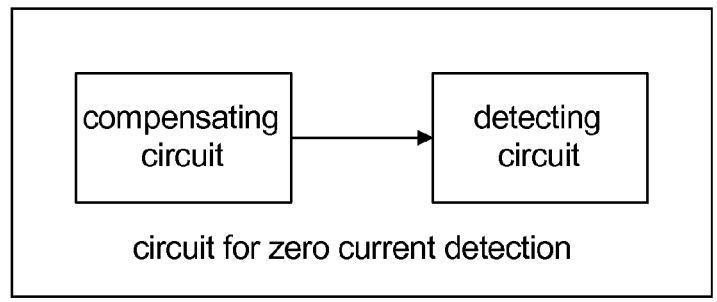
FIG. 8 illustrates generally an example zero current detection circuit.

FIG. 8 illustrates generally an example circuit for zero current detection including a compensating circuit and a detecting circuit. The compensating circuit can be configured to feed back a compensating voltage to the detecting circuit according to the output voltage of a DC-DC converting circuit. The detecting circuit can be configured to dynamically adjust Voffset according to the compensating voltage, and to perform zero current detection of the DC-DC converting circuit according to the adjusted Voffset.

In certain examples, the compensating circuit can be specifically configured to feed, when the DC-DC converting circuit is a BUCK circuit, the output voltage of the BUCK circuit, serving as the compensating voltage, back to the detecting circuit.

Figure 9:
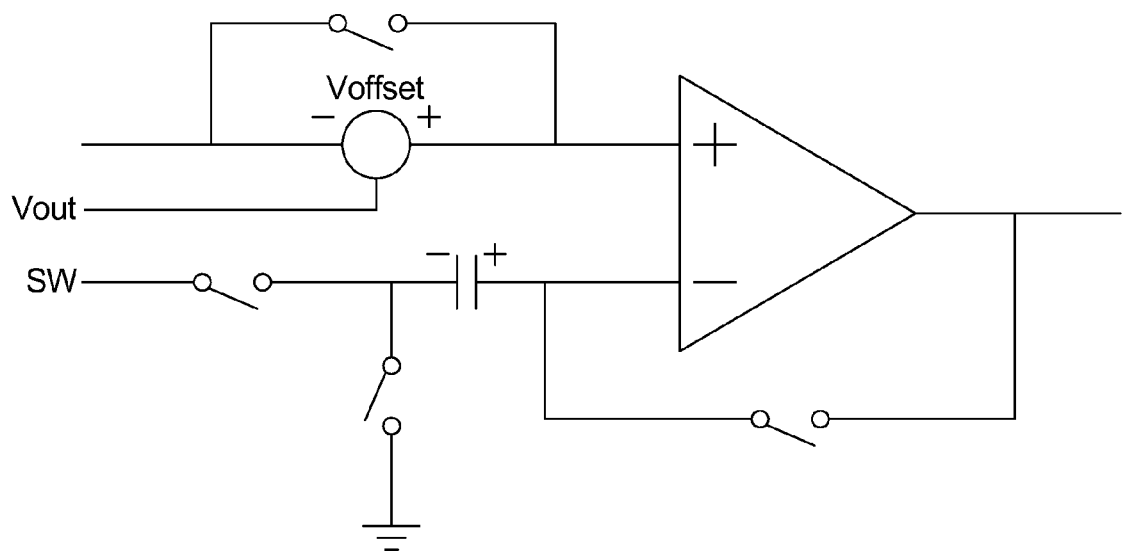
FIG. 9 illustrates generally an example zero current detection circuit for a BUCK circuit.
Figure 10:
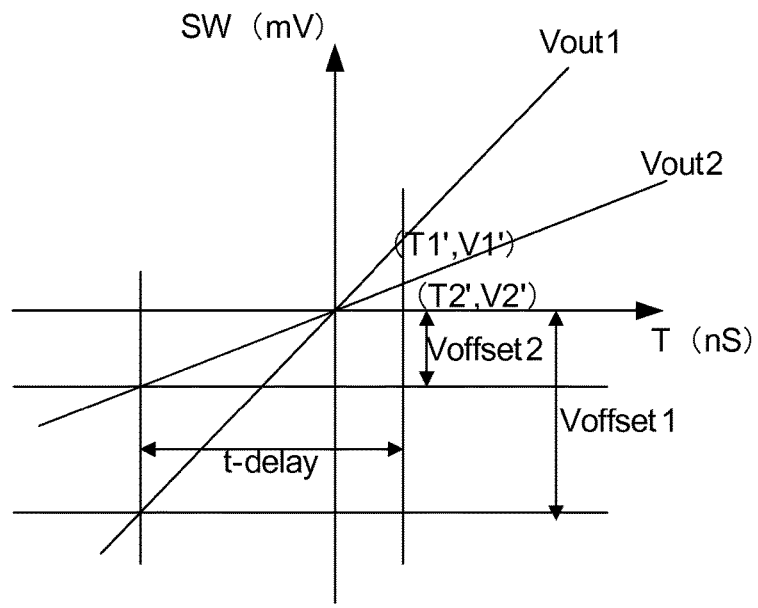
FIG. 10 illustrates graphically the voltage of SW versus time in the zero current detection circuit for the BUCK circuit in FIG. 9.

FIG. 9 illustrates generally an example detection circuit. The output voltage Vout of the BUCK circuit can be fed back to Voffset of the detecting circuit, and therefore Voffset increases when Vout increase, under the circumstance of the same t-delay, the voltage of SW barely changes at the completion of the response of the circuit for zero current detection. FIG. 10 illustrates graphically the voltage of SW versus time in an example zero current detection circuit for the BUCK circuit, wherein output voltage Vout1 is greater than output voltage Vout2, the slope of the curve of the voltage of SW corresponding to output voltage Vout1 versus time is greater than the slope of the curve of the voltage of SW corresponding to output voltage Vout2 versus time. After the output voltage Vout1 and the output voltage Vout2 are fed back to Voffset of the detecting circuit, Voffset1 is greater than Voffset2. Under the circumstance of the same t-delay, the voltage of SW triggering the circuit for zero current detection corresponding to output voltage Vout1 is V1', with time T1'. The voltage of SW triggering the circuit for zero current detection corresponding to output voltage Vout2 is V2', with time T2'. As illustrated in FIG. 10, the voltage of SW triggering the circuit for zero current detection can change as the output voltage changes, and when the circuit for zero current detection completes responding, change in the voltage of SW |V1'−V2'| is small, eliminating influence of change in the output voltage on the slope of change in the voltage of SW.

In certain examples, the compensating circuit can be specifically configured to feed, when the DC-DC converting circuit is a BOOST circuit, the difference between the input voltage and the output voltage of the BOOST circuit, serving as the compensating voltage, back to the detecting circuit.

Figure 11:
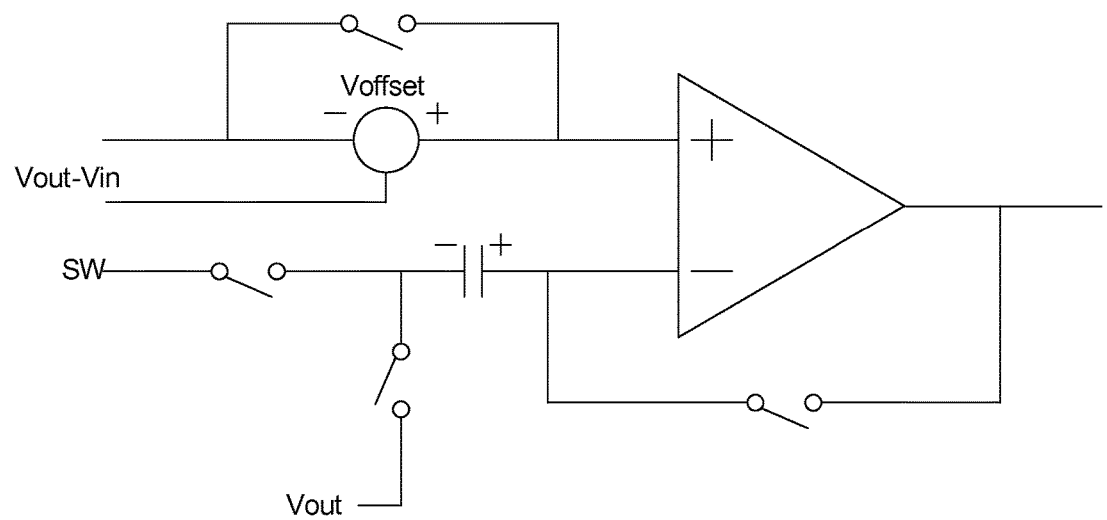
FIG. 11 illustrates generally an example zero current detection circuit for a BOOST circuit.
Figure 12:
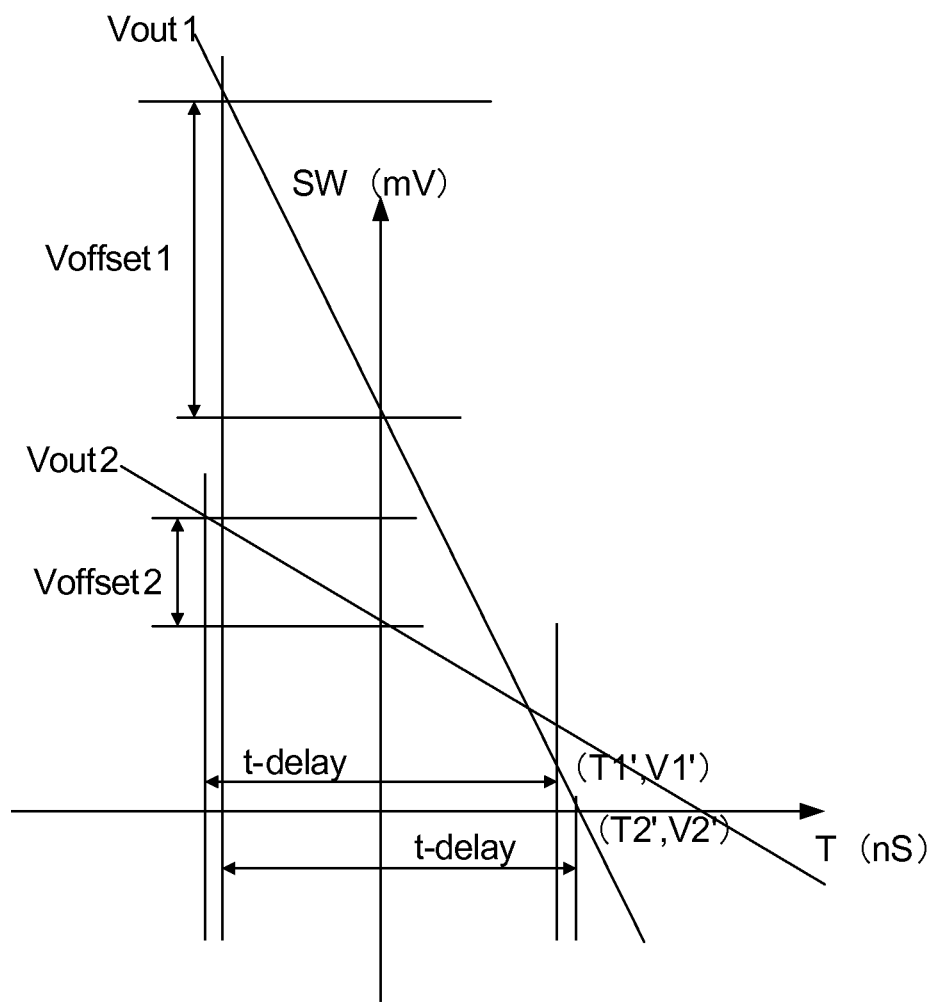
FIG. 12 illustrates graphically the voltage of SW versus time in the example zero current detection circuit for the BOOST circuit.

FIG. 11 illustrates generally an example zero current detection circuit for a BOOST circuit. As shown in FIG. 11, the difference between the output voltage Vout and the input voltage Vin of the BOOST circuit can be fed back to Voffset of the detecting circuit, such that Voffset increases when Vout increases. The voltage of SW triggering the circuit for zero current detection increases, under the circumstance of the same t-delay. The difference between the voltage of SW at the completion of the response of the circuit for zero current detection and the output voltage Vout barely changes. FIG. 12 illustrates graphically the voltage of SW versus time in the example zero current detection circuit for the BOOST circuit, wherein output voltage Vout1 is greater than output voltage Vout2, the slope of the curve of the voltage of SW corresponding to output voltage Vout1 versus time is greater than the slope of the curve of the voltage of SW corresponding to output voltage Vout2 versus time. After the difference between output voltage Vout1 and input voltage Vin and the difference between output voltage Vout2 and input voltage Vin are fed back to Voffset of the detecting circuit, Voffset1 is greater than Voffset2, Voffset1 is greater than Voffset2. Under the circumstance of the same t-delay, the voltage of SW at the completion of the response of the zero current detection circuit corresponding to output voltage Vout1 is V1', with time T1'; the voltage of SW at the completion of the response of the zero current detection circuit corresponding to output voltage Vout2 is V2', with time T2'. It can be seen that, the difference between the voltage of SW triggering the circuit for zero current detection and the output voltage changes as the output voltage changes, the difference between |V1'-Vout1| and |V2'-Vout2| is small at the completion of the response of the circuit for zero current detection, eliminating the influence of change in the output voltage on the slope of change in the voltage of SW.

Figure 13:
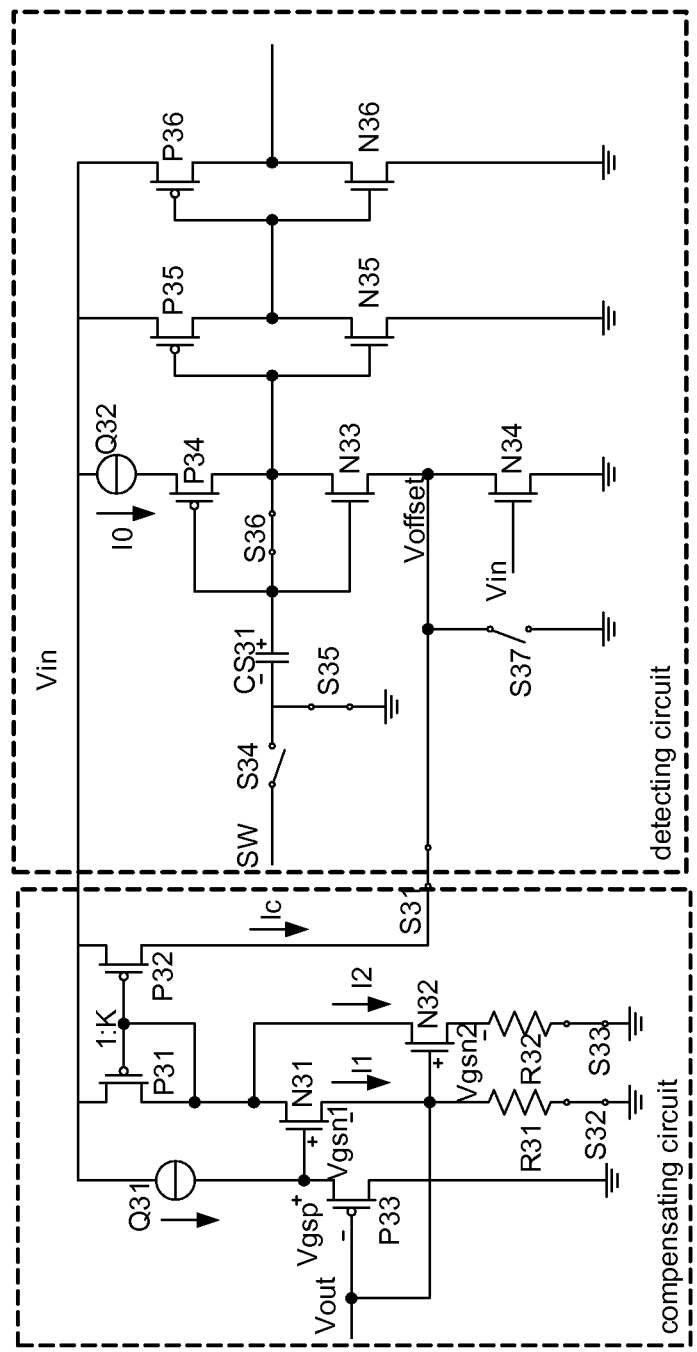
FIG. 13 illustrates generally an example zero current detection circuit for a BUCK circuit.

FIG. 13 illustrates generally an example zero current detection circuit for a BUCK circuit operating under the sampling state an including a compensating circuit and a detection circuit. In certain examples, the compensating circuit can include a PMOS P31, a PMOS P32, a PMOS P33, a switch S31, a switch S32, a switch S33, a current source Q31, a NMOS N31, a NMOS N32, a resistor R31, and a resistor R32, wherein the PMOS P31 and the PMOS P32 are in cascode connection, the sources of the PMOS P31 and the PMOS P32 are connected to the input voltage Vin of the BUCK circuit, the drain and the source of the PMOS P31 are connected together to the drains of the NMOS N31 and the NMOS N32, the drain of the PMOS P32 is connected to Voffset via the switch S31, the gate of the PMOS P33 is connected to the source of the NMOS N31, to the gate of the NMOS N32, and to the output voltage Vout of the BUCK circuit. The drain of the PMOS P33 is grounded. The source of the PMOS P33 is connected to the negative electrode of the current source Q31 and to the gate of the NMOS N31. The source of NMOS N31 is connected to resistor R31. The source of the NMOS N32 is connected to the resistor R32. The positive electrode of the current source Q31 is connected to the input voltage Vin. Resistor R31 is grounded via the switch S32. Resistor R32 is grounded via the switch S33.

In certain examples, the detecting circuit can include a switch S34, a switch S35, a switch S36, a switch S37, a PMOS P34, a PMOS P35, a PMOS P36, a NMOS N33, a NMOS N34, a NMOS N35, a NMOS N36, a current source Q32, and a capacitor CS31. One end of the switch S34 is connected to a switch node SW. The other end of the switch S34 is connected to the negative electrode of the capacitor CS31 and to the switch S35. The other end of the switch S35 is grounded. The positive electrode of the capacitor CS31 is connected to the gates of the PMOS P34 and the NMOS N33. The source of the PMOS P34 is connected to the negative electrode of the current source Q32. The drain of PMOS P34 is connected to the drain of the NMOS N33, and to the gates of the PMOS P35 and the NMOS N35. The positive electrode of the current source Q32 is connected to the input voltage Vin. The source of the NMOS N33 is connected to the compensating circuit, to the drain of the NMOS N34, and possibly to ground via the switch S37. The switch S36 is connected between the gate and the drain of the NMOS N33. The drain voltage of the NMOS N34 is Voffset. The source of the NMOS N34 is grounded. The gate of the NMOS N34 is connected to the input voltage Vin. PMOS P35 and NMOS N35 and PMOS P36 and NMOS N36 are connected to be two inverters. The drains of PMOS P36 and NMOS N36 can form the output of the circuit for zero current detection.

During the operation of the circuit for zero current detection as shown in FIG. 13, the switch S31, switch S32, switch S33, switch S35, switch S36 are closed, the switch S34 and switch S37 are open, and the output voltage Vout is converted into the current using resistor R31 and resistor R32. The current on resistor R31 is I1. The current on resistor R32 is I2. The current of the drain of the PMOS P32 obtained by mirroring is Ic=I1+I2. The product of Ic and the on resistance Ron of the NMOS N34 is the compensating voltage, which can be fed back to the drain of the PMOS P32, to adjust Voffset. In certain examples, the voltage of charged capacitor CS31 can be the sum of the adjusted Voffset and the flipping voltage of the inverter formed by PMOS P34, NMOS N33, and the current source Q32; The adjusted Voffset is:

$$V_{offset} = R_{on}(I_0 + I_c) =$$
$$R_{on}(I_0 + KI_1 + KI_2) = R_{on}\left(I_0 + K\frac{V_{out} + V_{gsp} - V_{gsn1}}{R_{31}} + K\frac{V_{out} - V_{gsn2}}{R_{32}}\right)$$

wherein, $I_0$ is the current provided by the current source Q32, K is the current mirroring ratio of the current mirror formed by the PMOS P31 and the PMOS P32, Vgsp is the source-gate voltage of the PMOS P33, Vgsn1 is the gate-source voltage of the NMOS N31, and Vgsn2 is the gate-source voltage of the NMOS N32.

When there is also Vref on Voffset, the aforementioned voltage of charged capacitor CS31 is the sum of the adjusted Voffset and Vref.

Figure 14:
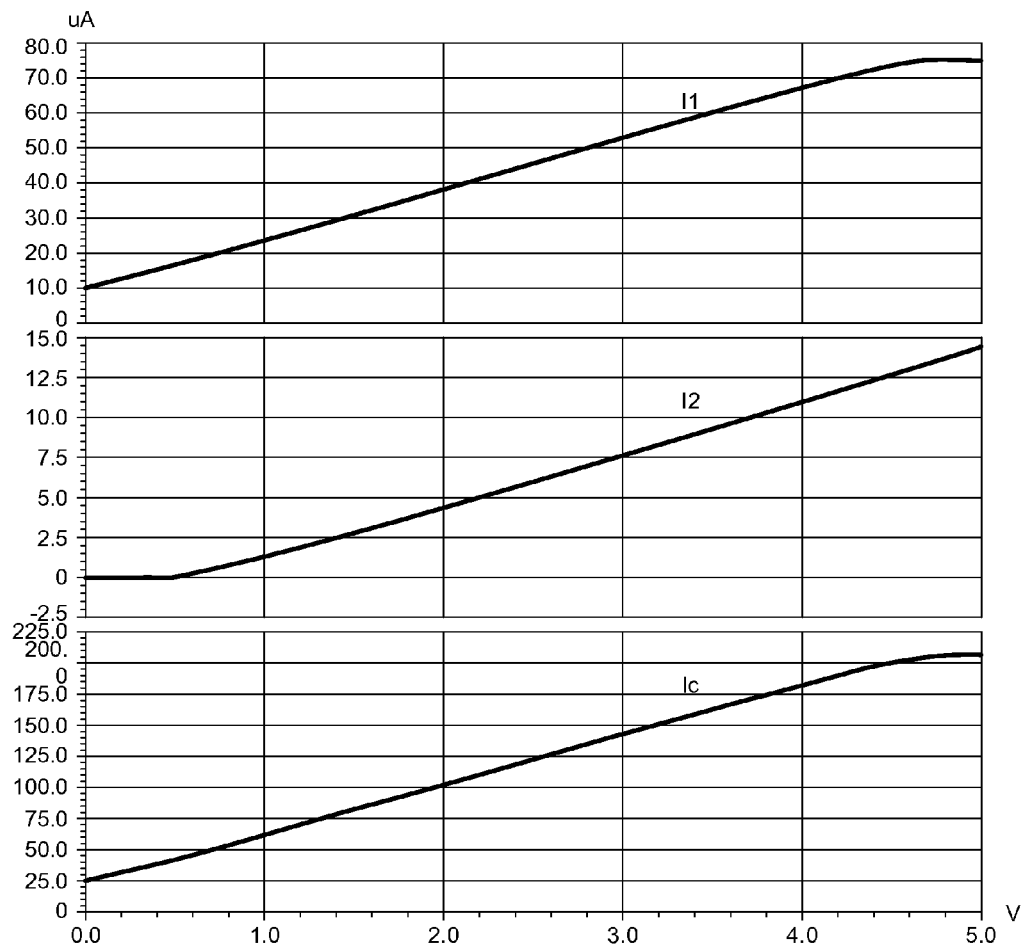
FIG. 14 is the schematic view of the relation between currents I1, I2, and Ic in FIG. 13.

In an example, with the input voltage Vin=5.5V, and the output voltage Vout changes from 04V to 5V, the relation between currents I1, I2, and Ic is as shown in FIG. 14. Referring to FIG. 14, when the output voltage Vout is less than Vgsn2, I2=0, and Ic=I1. When the output voltage Vout is greater than the difference between the input voltage Vin and Vgsp, the current I1 no longer increases as the output voltage Vout increases, while the current I2 increases as the output voltage Vout increases, providing additional current compensation for the current Ic.

Figure 15:
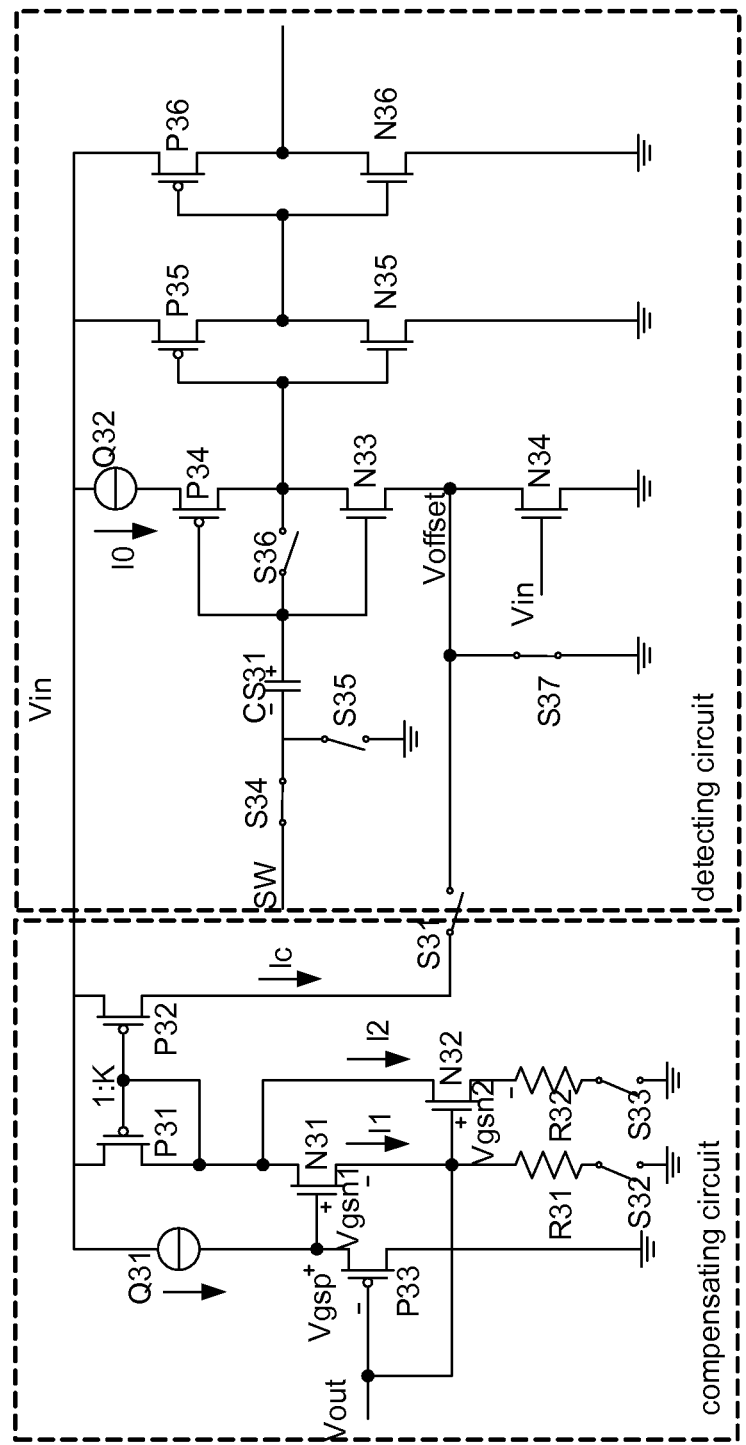
FIG. 15 illustrates generally an example zero current detection circuit for a BUCK circuit.

FIG. 15 illustrates generally an example zero current detection circuit for a BUCK circuit operating under the comparing state. The structure of the zero current detection circuit is the same as the example of FIG. 13. The switch S31, switch S32, switch S33, switch S35, and switch S36 are open, the switch S34 and switch S37 are closed. When the voltage of SW is equal to the negative of the adjusted Voffset, the drains of PMOS P36 and NMOS N36 output a high level.

Figure 16:
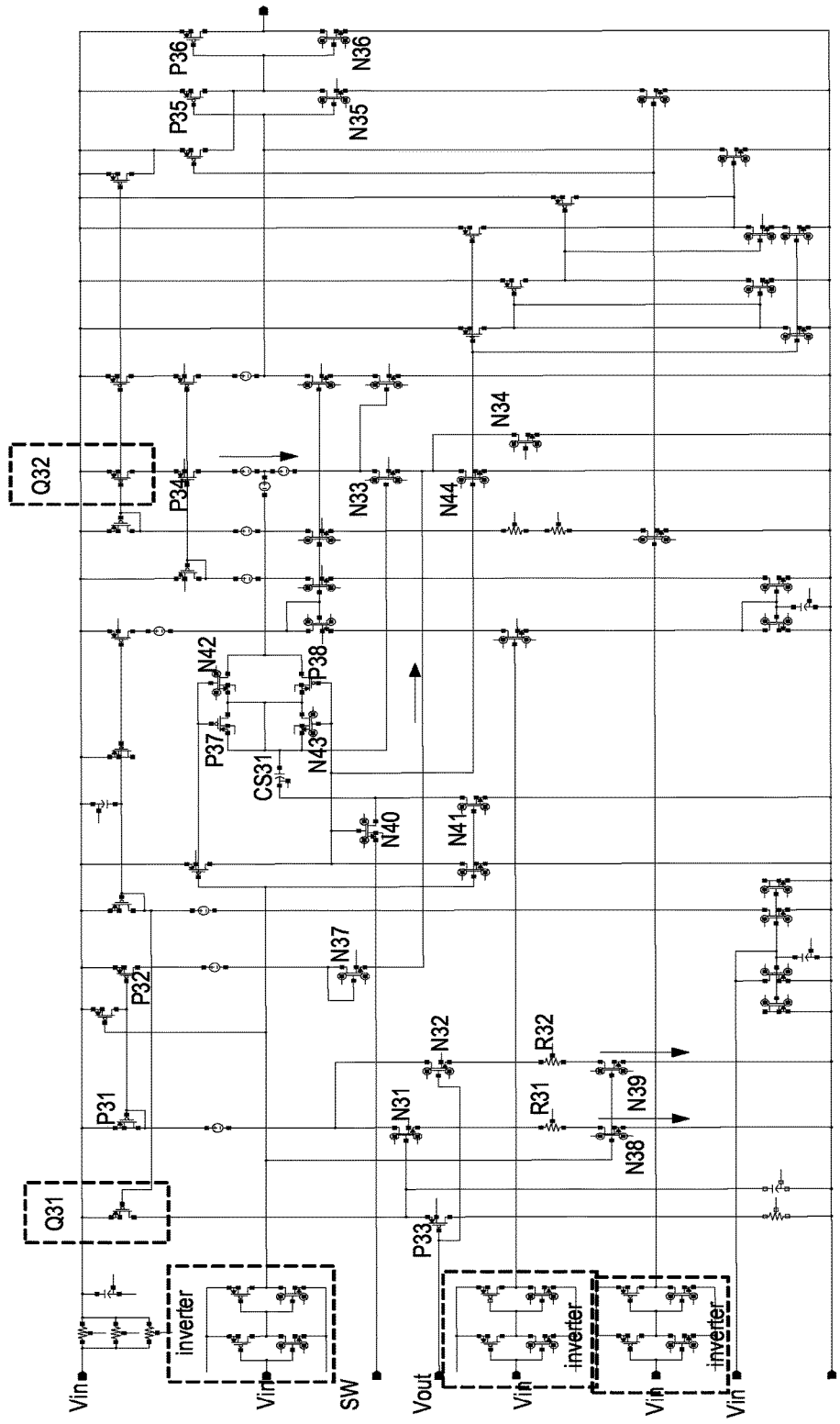
FIG. 16 shows example connection of the zero current detection circuit for a BUCK circuit.

FIG. 16 shows example connection of the zero current detection circuit for a BUCK circuit. The compensating circuit and the detecting circuit of the zero current detection circuit shown in FIG. 16 are the same as shown in FIG. 13 or FIG. 15. The NMOS N37 implements the switch S31, the NMOS N38 implements the switch S32, the NMOS N39 implements the switch S33, the NMOS N40 implements the switch S34, the NMOS N41 implements the switch S35, the NMOS N42, NMOS N43, PMOS P37, PMOS P38 implement the switch S36, and the NMOS N44 implements the switch S37. The input voltage Vin is enhanced via a two-stage inverter, and current source Q31 and current source Q32 are implemented via a current mirror structure.

Figure 17:
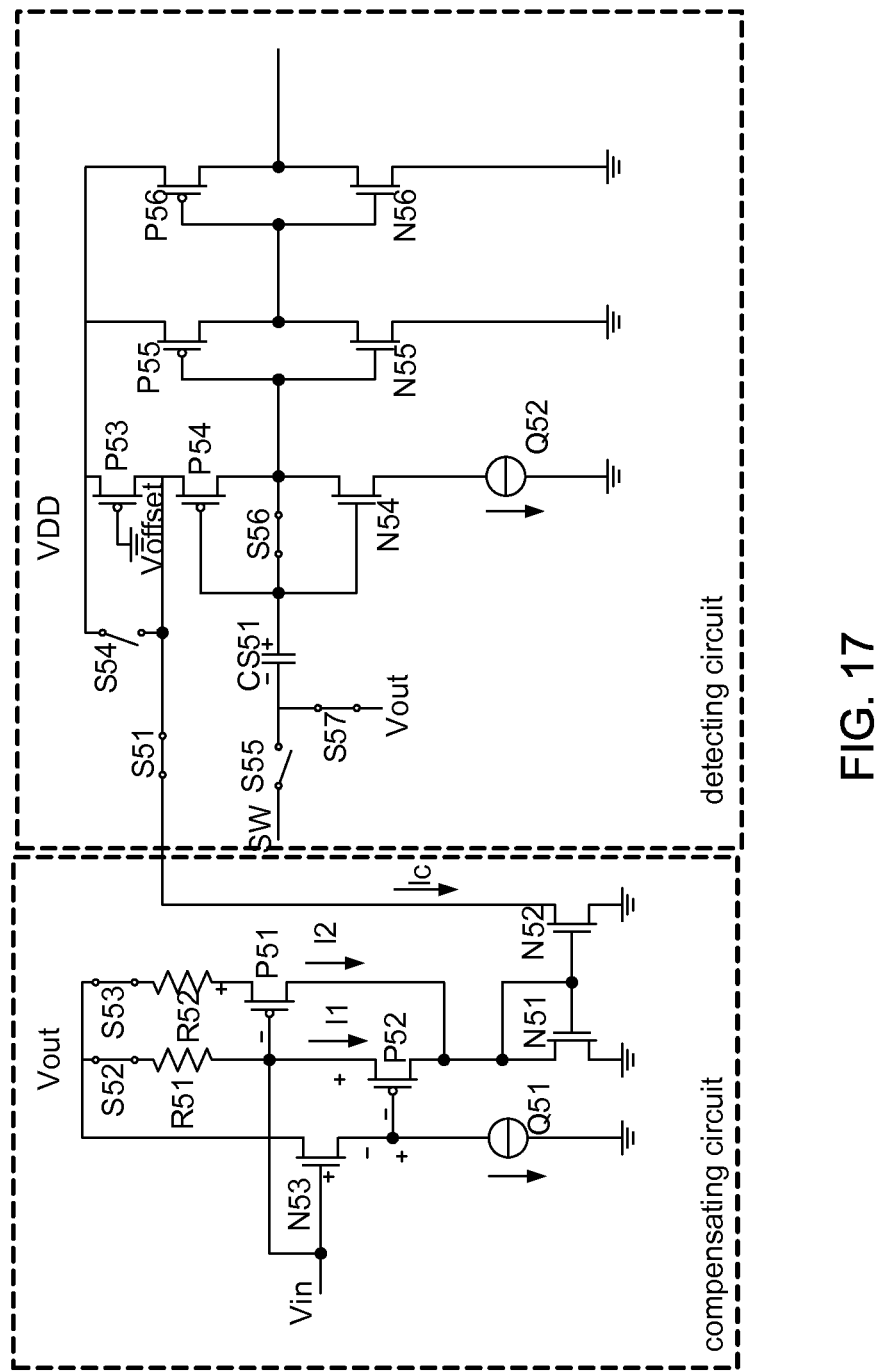
FIG. 17 illustrates generally an example zero current detection circuit for a BOOST circuit.

FIG. 17 illustrates generally an example zero current detection circuit for a BOOST circuit operating under the sampling state an including a compensating circuit and a detection circuit. In certain examples, the compensating circuit can include a NMOS N51, a NMOS N52, a NMOS N53, a switch S51, a switch S52, a switch S53, a current source Q51, a PMOS P51, a PMOS P52, a resistor R51, and a resistor R52. The NMOS N51 and the NMOS N52 can be in cascode connection, with the source of the NMOS N51 and the source of the NMOS N52 being grounded, The drain and the gate of NMOS N51 are connected together to the drains of the PMOS P51 and the PMOS P52. The drain of the NMOS N52 is connected to Voffset via the switch S51. The gate of the NMOS N53 is connected to the gate of the PMOS P51, to the source of the PMOS P52, and to the input voltage Vin of the BOOST circuit. the drain of the NMOS N53 is connected to the output voltage Vout of the BOOST circuit. The source of the NMOS N53 is connected to the positive electrode of the current source Q51 and to the gate of the PMOS P52. The source of the PMOS P51 is connected to the resistor R52. The source of the PMOS P52 is connected to the resistor R51. The negative electrode of the current source Q51 is grounded. The resistor R51 is connected to the output voltage Vout via the switch S52. The resistor R52 is connected to the output voltage Vout via the switch S53.

In certain examples, the detecting circuit can include a switch S54, a switch S55, a switch S56, a switch S57, a PMOS P53, a PMOS P54, a PMOS P55, a PMOS P56, a NMOS N54, a NMOS N55, a NMOS N56, a current source Q52, and a capacitor CS51. One end of the switch S54 is connected to a supply voltage VDD, and the other end of the switch S54 is connected to the drain of the PMOS P53. The gate of the PMOS P53 is grounded, the source of the PMOS P53 is connected to the supply voltage VDD, and the drain of the PMOS P53 is connected to the compensating circuit and to the source of the PMOS P54. One end of the switch S55 is connected to SW, and the other end of the switch S55 is connected to the negative electrode of the capacitor CS51 and to the output voltage Vout via the switch S57. The positive electrode of the capacitor CS51 is connected to the gates of the PMOS P54 and the NMOS N54. The switch S56 is connected between the gate and the drain of the PMOS P54. The source of the PMOS P54 is connected to the compensating circuit, the source voltage of PMOS P54 being Voffset. The drains of the NMOS N54 and the PMOS P54 are connected together to the gates of the PMOS P55 and the NMOS N55. The source of the NMOS N54 is connected to the positive electrode of the current source Q52. The negative electrode of the current source Q52 is grounded. The PMOS P55 and the NMOS N55, the PMOS P56 and the NMOS N56 are connected to form two inverters. The drains of the PMOS P56 and the NMOS N56 are the output of the circuit for zero current detection.

During the operation of the zero current detection circuit shown in FIG. 17, the switch S51, switch S52, switch S53, switch S56, and switch S57 are closed, the switch S54 and switch S55 are open, the difference between the output voltage Vout and the input voltage Vin is converted into the current on the resistor R51 and the current on the resistor R52. The current on the resistor R51 is I2, and the current on the resistor R52 is I1. The current on the drain of the NMOS N52 obtained by mirroring is Ic=I1+I2. The product of Ic and the on resistance Ron of the PMOS P53 is the compensating voltage, which can be fed back to the source of the PMOS P54, to adjust Voffset. The voltage of charged capacitor CS51 is the output voltage Vout of the BOOST circuit subtracted by the adjusted Voffset and then subtracted by the flipping voltage of the inverter formed of the PMOS P54, the NMOS N54 and the current source Q52.

When there is also Vref on Voffset, the voltage on the charged CS51 is the sum of the adjusted Voffset and Vref.

Figure 18:
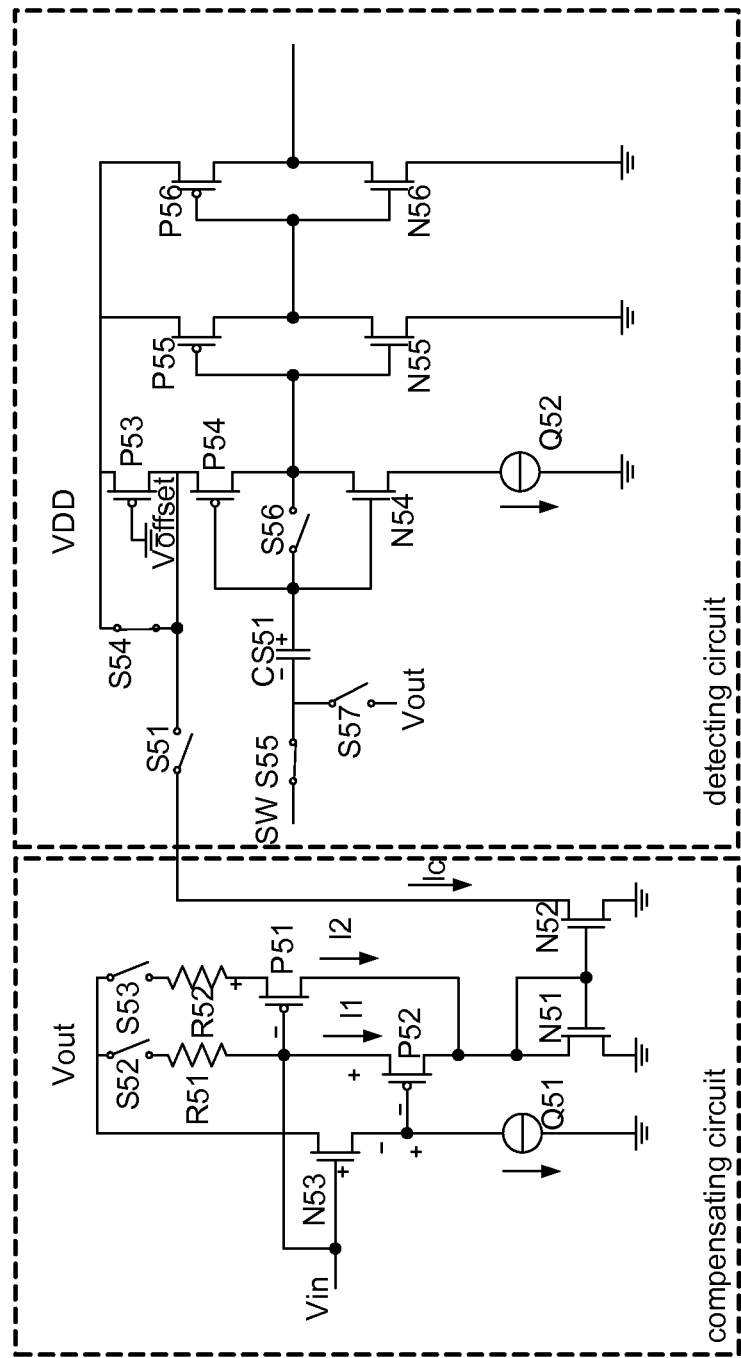
FIG. 18 illustrates generally an example zero current detection circuit for a BOOST circuit.

FIG. 18 illustrates generally an example zero current detection circuit for a BOOST circuit operating under the comparing state. The structure of the zero current detection circuit is the same as shown in FIG. 17. The switch S51, switch S52, switch S53, switch S56, and switch S57 are open, the switch S54 and switch S55 are closed, and when the voltage of SW is equal to the sum of the output voltage Vout of the BOOST circuit and the adjusted Voffset, the drains of the PMOS P56 and the NMOS N56 output a high level.

Figure 19:
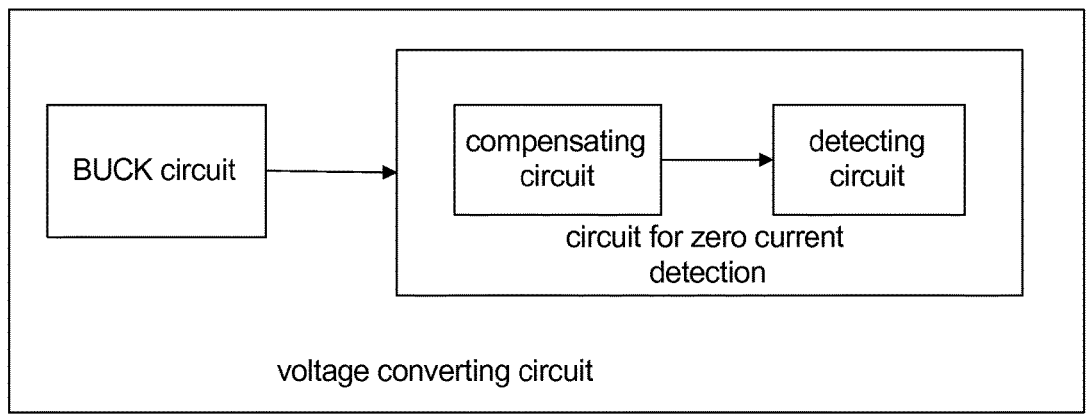
FIG. 19 illustrates generally an example converter including a BUCK circuit.

FIG. 19 illustrates generally an example converter including a BUCK circuit and a circuit for zero current detection. In certain examples, the converter can include the BUCK circuit configured to lower a DC voltage via a switch device, and to generate an output voltage, and the zero current detection circuit that can be configured to dynamically adjust Voffset according to the output voltage, and perform zero current detection of the BUCK circuit according to adjusted Voffset.

In certain examples, the zero current detection circuit can include a compensating circuit and a detecting circuit. The compensating circuit can be configured to feed back a compensating voltage to the detecting circuit according to the output voltage of the BUCK circuit. The detecting circuit can be configured to dynamically adjust Voffset according to the compensating voltage, and perform zero current detection of the BUCK circuit according to the adjusted Voffset.

Figure 20:
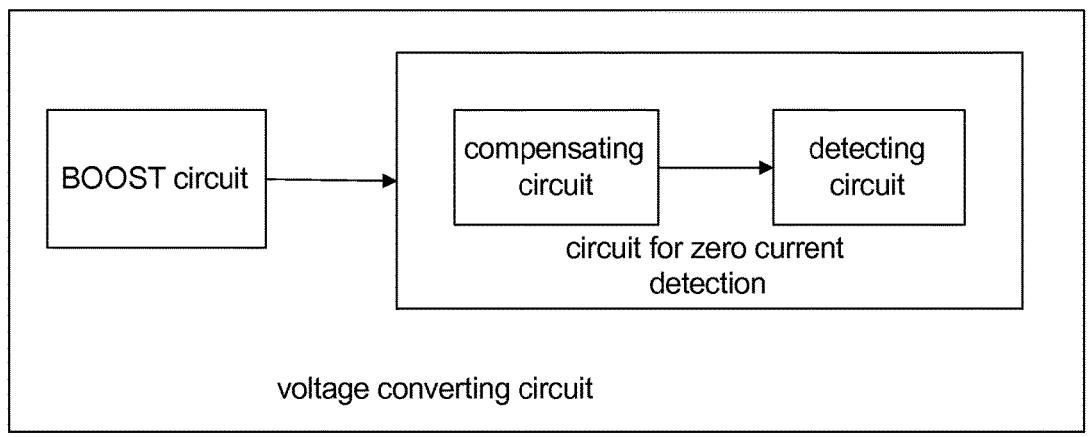
FIG. 20 illustrates generally an example converter including a BOOST circuit.

FIG. 20 illustrates generally an example converter including a BOOST circuit and a circuit for zero current detection. in certain examples, the converter can include the BOOST circuit configured to boost a DC voltage via a switch device, and to generate an output voltage, and the zero current detection circuit that can be configured to dynamically adjusts Voffset according to the output voltage, and perform zero current detection of the BOOST circuit according to adjusted Voffset.

In certain examples, the circuit for zero current detection can include a compensating circuit and a detecting circuit. The compensating circuit can be configured to feed back a compensating voltage to the detecting circuit according to the output voltage of the BOOST circuit. The detecting circuit can be configured to dynamically adjust Voffset according to the compensating voltage, and perform zero current detection of the BOOST circuit according to adjusted Voffset.

In certain examples, a method for zero current detection can include feeding back a compensating voltage according to an output voltage of a DC-DC converting circuit, and dynamically adjusting Voffset according to the compensating voltage, and performing zero current detection of the DC-DC converting circuit according to the adjusted Voffset. In certain examples, the DC-DC converting circuit can include a BUCK circuit. In some examples, the compensating voltage can be the output voltage of the BUCK circuit. In certain examples, the DC-DC converting circuit can include a BOOST circuit. In some examples, the compensating voltage can be the difference of the input voltage and the output voltage of the BOOST circuit.

In certain examples, the voltage of SW triggering the circuit for zero current detection of the present disclosure can change as the output voltage of the DC-DC converting circuit changes, such that the accuracy of zero current detection can be increased effectively when the triggering delay of the circuit for zero current detection remains unchanged.

ADDITIONAL NOTES

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A zero current detection circuit for a voltage converter, the zero current detection circuit comprising:
    a first input configured to receive a zero detection reference voltage indicative of a operation delay of the zero current detection circuit;
    a second input for receiving a compensating voltage to compensate for a triggering delay of the zero current detection circuit, the compensating voltage being in response to an output voltage of the voltage converter;
    a third input configured to receive a switch voltage from a switch of the voltage converter;
    an offset voltage source, connected to the first input, configured to provide an offset voltage responsive to the compensating voltage; and
    a comparator configured to receive the offset voltage and the switch voltage during a sampling state of the zero current detection circuit and to provide, during a comparing state of the zero current detection circuit, an indication of zero current passing through the switch of the voltage converter when the switch voltage is equal to a negative representation of the offset voltage.

2. The zero current detection circuit of claim 1, further comprising:
    a sampling capacitor coupled to an inverting input of the comparator,
    the offset voltage source having an output is coupled to a non-inverting input of the comparator.

3. The zero current detection circuit of claim 1, further comprising:
    a switch of the zero current detection circuit configured to short the offset voltage source during the comparing state and to not short the offset voltage source during the sampling state of the zero current detection circuit.

4. The zero current detection circuit of claim 1, further comprising:
    a sampling capacitor coupled to an inverting input of the comparator; and
    a switch of the zero current detection circuit configured to couple the third input with the sampling capacitor during the comparing state and to isolate the third input from the sampling capacitor during the sampling state.

5. The zero current detection circuit of claim 1, further comprising:
    a sampling capacitor coupled to the comparator; and
    a switch of the zero current detection circuit configured to couple an output of the comparator with a node of the sampling capacitor during the sampling state.

6. The zero current detection circuit of claim 1, further comprising:
    a sampling capacitor coupled to the comparator; and
    a switch configured to couple a node of the sampling capacitor with a ground during the sampling state.

7. The zero current detection circuit of claim 1, wherein the voltage converter is a boost converter and the compensating voltage is indicative of a difference between an input voltage of the boost converter and an output voltage of the boost converter.

8. The current detection circuit of claim 1, wherein the voltage converter is a buck converter and the compensating voltage is indicative of an output voltage of the buck converter.

9. A method of compensating for delays of a zero current detection circuit of a voltage converter:
the method comprising:
receiving a zero detection reference voltage indicative of an operation delay of the zero current detection circuit at a first input of a zero current detection circuit;
receiving a compensating voltage at an offset voltage source of the zero current detection circuit via a second input of the zero current detection circuit during a sampling phase, the compensating voltage being in response to an output voltage of the voltage converter, the offset voltage source connected in series with the first input;
compensating for a triggering delay of the delays of a zero current detection using the compensating voltage;
receiving a switch voltage from a switch of a voltage converter at a third input of the zero current detection circuit;
comparing an output of the offset voltage source and the switch voltage during a comparing phase of the zero current detection circuit; and
providing an indication of zero current passing through the switch of the voltage converter when the switch voltage is equal to a negative representation of an offset voltage provided by the offset voltage source.

10. The method of claim 9, wherein the comparing includes receiving an output of the offset voltage source at a non-inverting input of the comparator,
the method further comprising:
receiving an output of a sampling capacitor coupled to the third input at an inverting input of the comparator.

11. The method of claim 9, further comprising:
shorting the offset voltage source during the comparing state using a switch of the zero current detection circuit.

12. The method of claim 9, including:
coupling the third input with a sampling capacitor during the comparing state using a switch of the zero current detection circuit; and
isolating the third input from the sampling capacitor during the sampling state using the switch of the zero current detection circuit.

13. The method of claim 9, further comprising:
coupling an output of the comparator with a node of a sampling capacitor during the sampling state using a switch of the zero current detection circuit.

14. The method of claim 9, further comprising:
coupling a node of a sampling capacitor with a ground during the sampling state using a switch of the zero current detection circuit.

15. The method of claim 9, wherein the voltage converter is a boost converter, and
the receiving a compensating voltage includes receiving a compensating voltage indicative of a difference between an input voltage of the boost converter and an output voltage of the boost converter.

16. The method of claim 9, wherein the voltage converter is a buck converter, and
the receiving a compensating voltage includes receiving a compensating voltage indicative of an output voltage of the buck converter.

17. A zero current detection circuit, comprising:
a first input configured to receive a zero detection reference voltage;
a second input configured to receive a compensating voltage to compensate for a triggering delay of the zero current detection circuit, the compensating voltage being in response to an output voltage;
a third input configured to receive a switch voltage from voltage converter;
an offset voltage source connected to the first input and configured to provide an offset voltage in response to the compensating voltage; and
a comparator configured to receive the offset voltage and the switch voltage during a sampling state of the zero current detection circuit,
the comparator configured to provide, during a comparing state of the zero current detection circuit, an indication of zero current passing through the voltage converter.

18. The current detection circuit of claim 17, wherein the comparator is configured to provide, during a comparing state of the zero current detection circuit, an indication of zero current passing through a switch of the voltage converter when the switch voltage is equal to a negative representation of the offset voltage.

19. The zero current detection circuit of claim 17, further comprising:
a sampling capacitor coupled to an inverting input of the comparator,
the offset voltage source having an output is coupled to a non-inverting input of the comparator.

* * * * *